US010937881B2

(12) United States Patent
Chang et al.

(10) Patent No.: US 10,937,881 B2
(45) Date of Patent: Mar. 2, 2021

(54) GAS SENSOR AND METHOD FOR MAKING SAME

(71) Applicant: HON HAI PRECISION INDUSTRY CO., LTD., New Taipei (TW)

(72) Inventors: Wei-Chih Chang, New Taipei (TW); Hsin-Hua Lin, New Taipei (TW); Po-Li Shih, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/727,632

(22) Filed: Dec. 26, 2019

(65) Prior Publication Data

US 2020/0209187 A1   Jul. 2, 2020

Related U.S. Application Data

(60) Provisional application No. 62/785,708, filed on Dec. 28, 2018.

(51) Int. Cl.
| | |
|---|---|
| *H01L 29/66* | (2006.01) |
| *H01L 29/49* | (2006.01) |
| *H01L 29/786* | (2006.01) |
| *G01N 27/414* | (2006.01) |

(52) U.S. Cl.
CPC .... *H01L 29/4908* (2013.01); *H01L 29/66969* (2013.01); *H01L 29/78648* (2013.01); *G01N 27/4141* (2013.01); *H01L 29/66742* (2013.01); *H01L 29/7869* (2013.01)

(58) Field of Classification Search
CPC .................. H01L 21/77; H01L 21/822; H01L 21/823437; H01L 27/12; H01L 27/1214; H01L 27/1222; H01L 27/1225; H01L 27/1251; H01L 27/1259; H01L 27/127; H01L 27/28; H01L 27/283; H01L 27/286; H01L 29/401; H01L 29/43; H01L 29/49; H01L 29/4908; H01L 29/66; H01L 29/66007; H01L 29/66477; H01L 29/66742; H01L 29/66969; H01L 29/76; H01L 29/772; H01L 29/78; H01L 29/786; H01L 29/78642; H01L 29/78645; H01L 29/7869; G01N 27/414; G01N 27/4141
See application file for complete search history.

(56) References Cited

U.S. PATENT DOCUMENTS

2019/0027701 A1\*   1/2019   Lim ..................... C07D 487/04

\* cited by examiner

*Primary Examiner* — Cheung Lee
(74) *Attorney, Agent, or Firm* — ScienBiziP, P.C.

(57) ABSTRACT

A gas sensor with instantaneous electrical response and thus detection of gas which meets it includes a substrate, a bottom gate electrode on a surface of the substrate, an insulating layer on the surface of the substrate carrying the bottom gate electrode and completely covering the bottom gate electrode. A semiconductor layer is on a surface of the insulating layer away from the substrate. Both the source electrode and the drain electrode, spaced apart, are located on a side of the semiconductor layer away from the substrate each being coupled to the semiconductor layer. The gas sensor further includes a passivation layer covering the semiconductor layer and a top gate electrode on the passivation layer, the top gate electrode being spaced from both the source and drain electrodes. The top gate electrode is made of electrically-conductive and gas-sensitive material. A method for making same is also disclosed.

11 Claims, 7 Drawing Sheets

GAS SENSOR AND METHOD FOR MAKING SAME

FIELD

The subject matter herein generally relates to environmental controls, a gas sensor, and a method for making the gas sensor.

BACKGROUND

Figure 1:
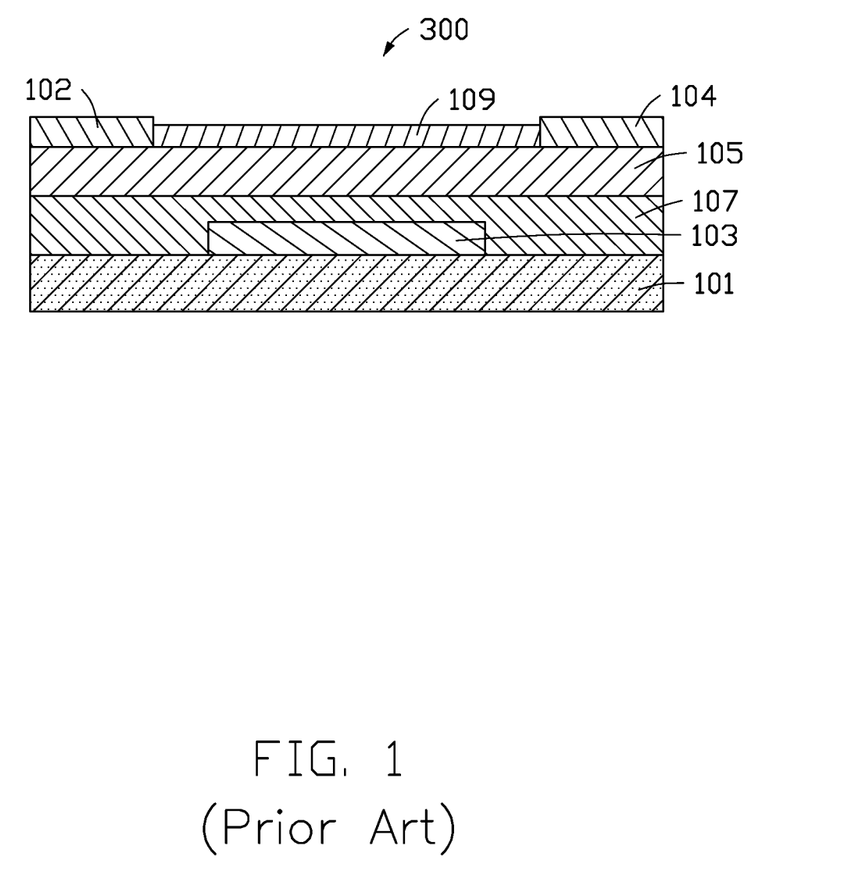
FIG. 1 is a cross-sectional view of a gas sensor in the prior art.

As shown in FIG. 1, a conventional gas sensor 300 includes a substrate 101 and a thin film transistor (TFT) on the substrate. The TFT includes a gate electrode 103, a semiconductor layer 105, and a source electrode 102 and a drain electrode 104 that are sequentially stacked on the substrate 101. An insulating layer 107 is further provided between the gate electrode 103 and the semiconductor layer 105 to electrically insulate the gate electrode 103 and the semiconductor layer 105 from each other. The source electrode 102 and the drain electrode 104 are connected to opposite sides of the semiconductor layer 105. An analyte layer 109 is coated on an outer surface of the gas sensor 200, particularly on a surface of the semiconductor layer 105 away from the gate electrode 103. One or more gases may react with substance or substances in the analyte layer 109 to form a specific product, and the product may gradually diffuse into the interface between the gate electrode 103 and the insulating layer 107, thereby causing the electrode voltage in the TFT to change, thus the gas can be detected. However, it may take a long time for the product to diffuse into the TFT, resulting in a slow speed of gas sensing.

BRIEF DESCRIPTION OF THE DRAWINGS

Implementations of the present technology will now be described, by way of embodiments only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

First Embodiment

Figure 2:
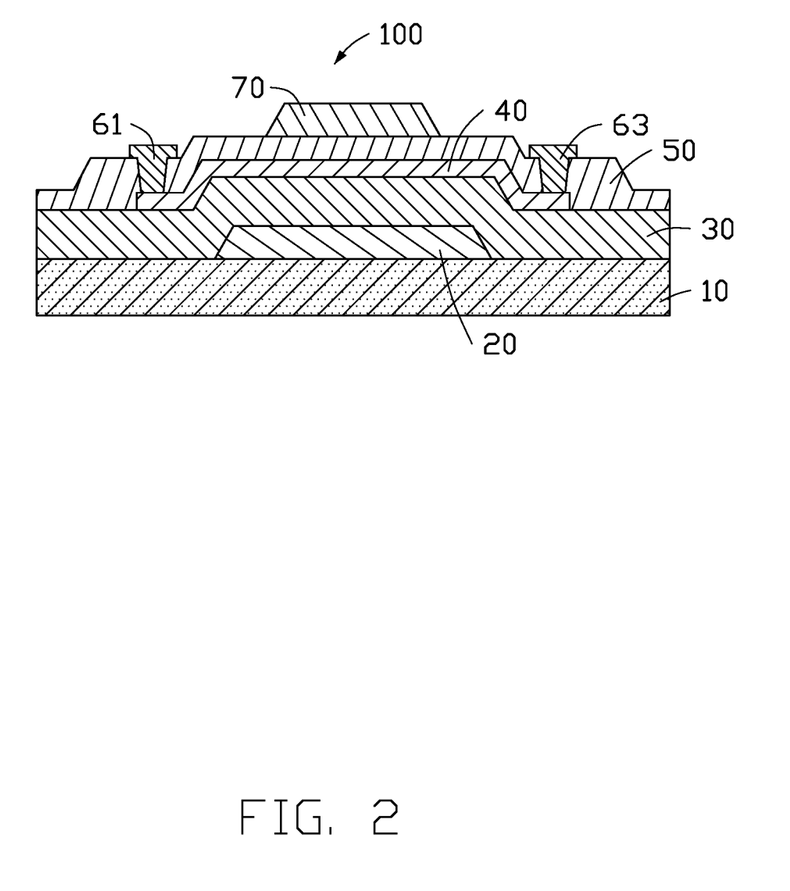
FIG. 2 is a cross-sectional view of a gas sensor in accordance with a first embodiment.

FIG. 2 illustrates a gas sensor 100 according to a first embodiment. The gas sensor 100 includes a substrate 10, a bottom gate electrode 20, an insulating layer 30, a semiconductor layer 40, a passivation layer 50, and a source electrode 61 and a drain electrode 63 stacked in that order. The bottom gate electrode 20 partially covers a surface of the substrate 10. The insulating layer 30 is formed on a surface of the substrate 10 carrying the bottom gate electrode 20 and completely covers the bottom gate electrode 20. The semiconductor layer 40 covers a side of the insulating layer 30 away from the substrate 10. The passivation layer 50 is located on the insulating layer 30 and completely covers the semiconductor layer 40. Both the source electrode 61 and the drain electrode 63 are located on a side of the passivation layer 50 away from the substrate 10 and extend through the passivation layer 50 so as to directly contact the semiconductor layer 40. The source electrode 61 and the drain electrode 63 are located on a surface of the semiconductor layer 40 away from the substrate 10 and are spaced apart from each other. The source electrode 61 and the drain electrode 63 are located at opposite ends of the semiconductor layer 40. The gas sensor 100 further includes a top gate electrode 70 located on a surface of the passivation layer 50 away from the substrate 10. The top gate electrode 70 is spaced apart from the source electrode 61 and the drain electrode 63. A projection of the semiconductor layer 40 on the substrate 10 overlaps a projection of the bottom gate electrode 20 on the substrate 10 along a thickness direction of the gas sensor 100; and a projection of the top gate electrode 70 on the substrate 10 at least partially overlaps with the projection of the bottom gate electrode 20 on the substrate 10.

Figure 3:
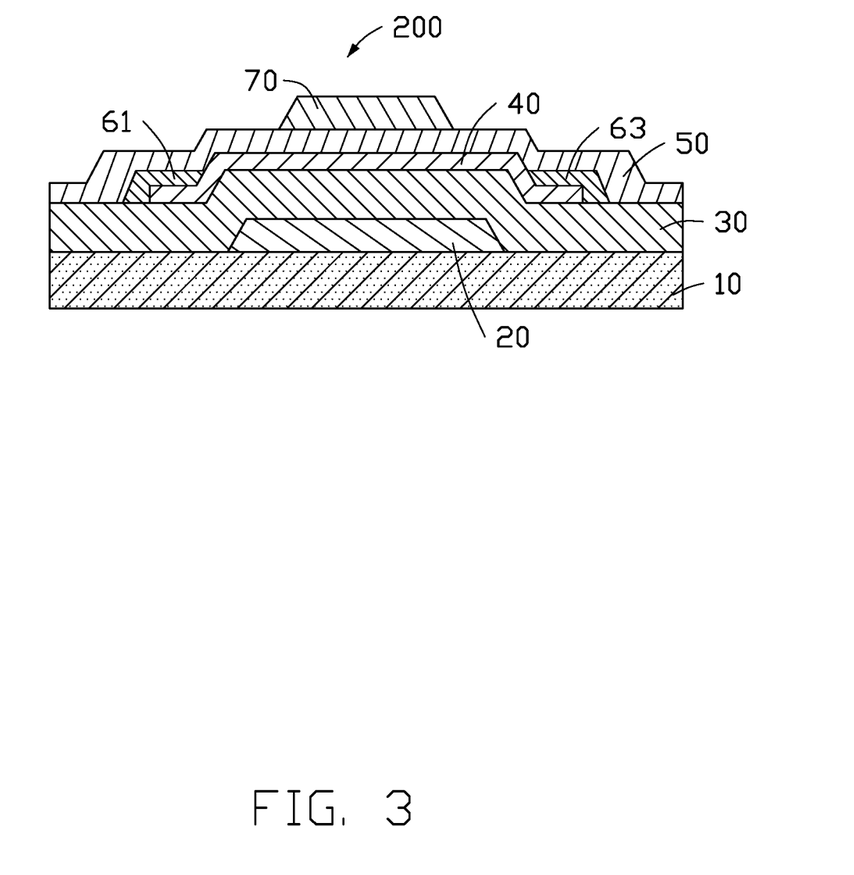
FIG. 3 is a cross-sectional view of a gas sensor in accordance with a second embodiment.

FIG. 3 illustrates a gas sensor 200 according to a second embodiment. The gas sensor 100 includes a substrate 10, a bottom gate electrode 20, an insulating layer 30, a semiconductor layer 40, a source electrode 61 and a drain electrode 63, a passivation layer 50, and a top gate electrode 70 stacked in that order. The bottom gate electrode 20 partially covers a surface of the substrate 10. The insulating layer 30 is formed on a surface of the substrate 10 carrying the bottom gate electrode 20 and completely covers the bottom gate electrode 20. The semiconductor layer 40 covers a side of the insulating layer 30 away from the substrate 10. Both the source electrode 61 and the drain electrode 63 are located on a side of the semiconductor layer 40 away from the substrate 10 and are spaced apart from each other. The source electrode 61 and the drain electrode 63 are located at opposite ends of the semiconductor layer 40. The passivation layer 50 is located on the insulating layer 30 and completely covers the semiconductor layer 40, the source electrode 61, and the drain electrode 63. The top gate electrode 70 is located on a surface of the passivation layer 50 away from the substrate 10. The top gate electrode 70 is spaced apart from both the source electrode 61 and the drain electrode 63. A projection of the semiconductor layer 40 on the substrate 10 overlaps a projection of the bottom gate electrode 20 on the substrate 10 along a thickness direction of the gas sensor 100; and a projection of the top gate electrode 70 on the substrate 10 at least partially overlaps with the projection of the bottom gate electrode 20 on the substrate 10.

In the above first and second embodiments, the top gate electrode 70 will be in direct contact with the gas to be detected and measured. Therefore, the top gate electrode 70 must be exposed to allow contact with the gas. No analyte layer is provided on the top gate electrode 70. The top gate electrode 70 is made of an electrically-conductive and gas-sensitive material. The gas-sensitive material refers to a material which changes its physical and/or chemical properties when in contact with a certain type of gas. In this embodiment, the top gate electrode 70 is made of a gas-sensitive material such as nano gold and nano platinum which change their voltage potential on adsorbing the gas.

The substrate 10 is made of an electrically insulating materials conventionally used in the art, such as glass, quartz, and plastic. In some embodiments, the substrate 10 may be a ceramic and/or silicon material.

The semiconductor layer 40 is made of a semiconductor material conventionally used in the art, such as silicon, indium gallium zinc oxide, indium zinc tin oxide, indium gallium tin oxide, indium aluminum zinc oxide, and the like.

The insulating layer 30 and the passivation layer 50 are made of electrical insulating materials conventionally used in the art, such as silicon oxide, silicon nitride, silicon oxynitride, aluminum oxide, yttrium oxide, hafnium oxide, zirconia nitrogen, aluminum nitride, aluminum nitride oxide, titanium oxide, barium titanate, lead titanate, or a combination thereof.

The source electrode 61, the drain electrode 63, and the bottom gate electrode 20 are made of conductive materials conventionally used in the art, such as aluminum, silver, gold, cobalt, chromium, copper, indium, manganese, molybdenum, nickel, neodymium, palladium, platinum, titanium, tungsten, zinc, or a combination thereof. In order to achieve transparency, in some embodiments, the conductive material may be selected from transparent conductive materials such as indium tin oxide, indium zinc oxide, aluminum-doped zinc oxide, or a combination thereof.

Figure 4A:
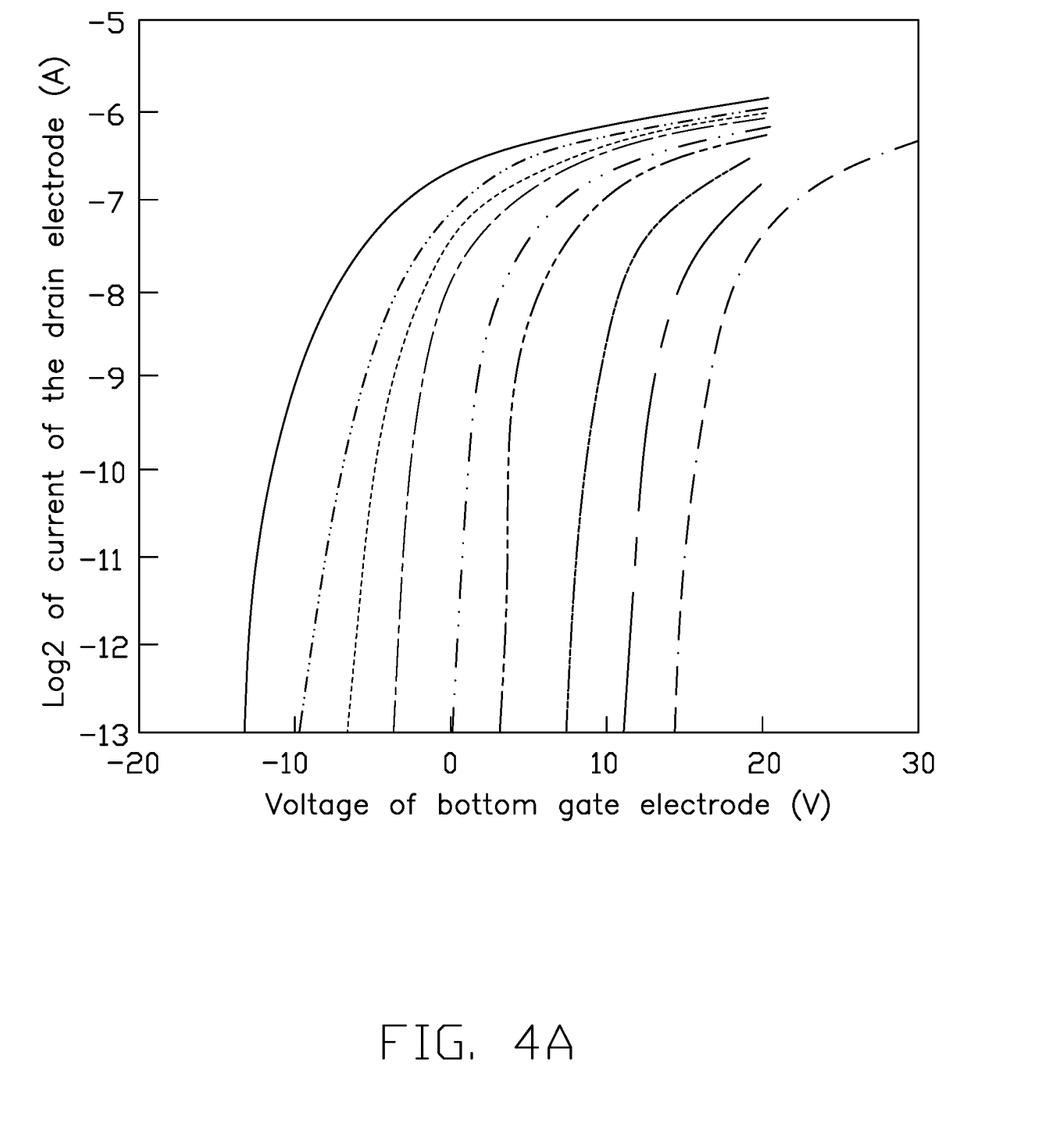
FIG. 4A and FIG. 4B are electrical performance charts of the gas sensor shown in FIG. 2.
Figure 4B:
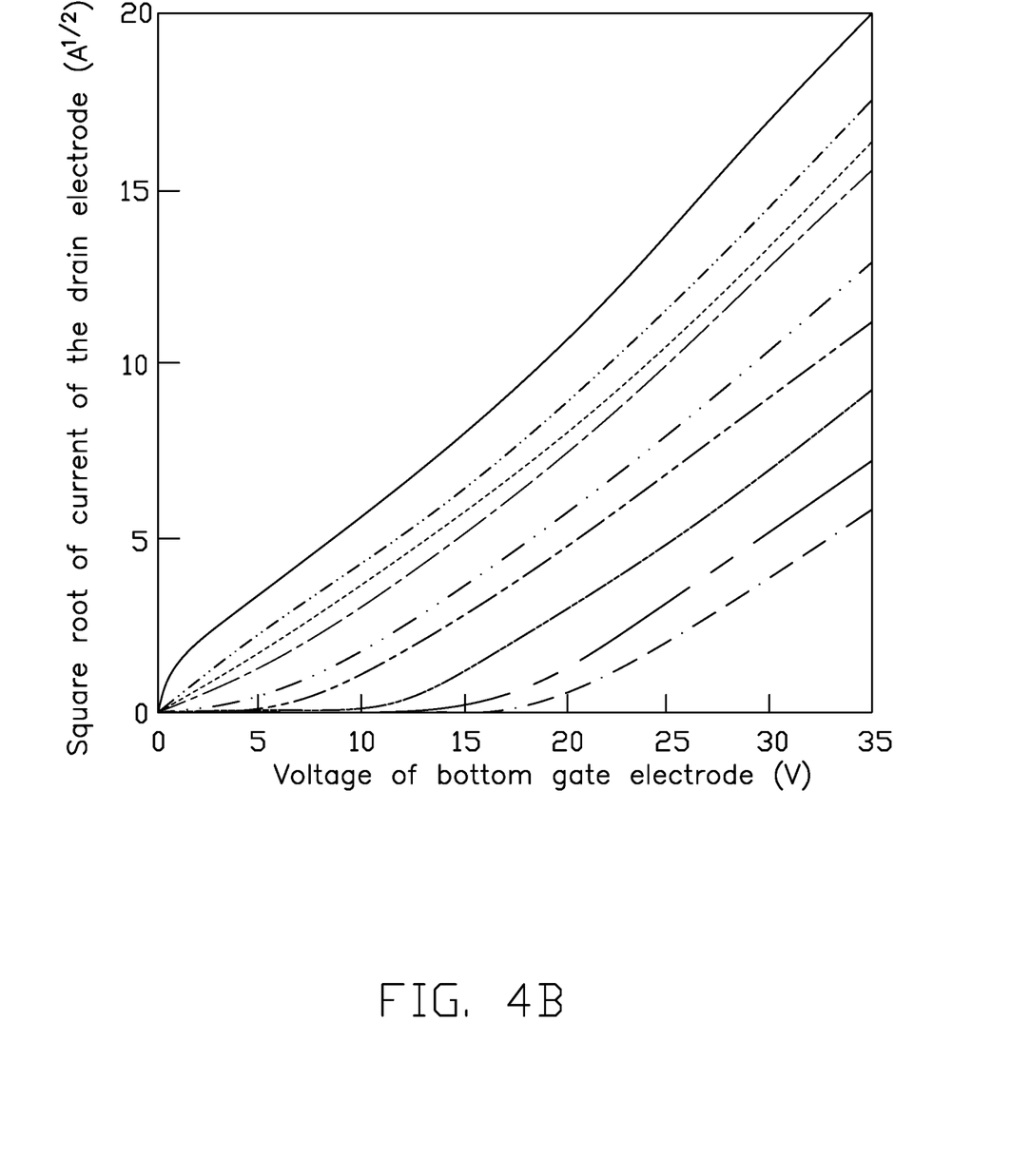

The main structure of each of the gas sensors 100 and 200 shown in FIG. 2 and FIG. 3 is a TFT having two gate electrodes. The graphs shown in FIGS. 4A and 4B show voltage and current affecting the TFT having a dual gate electrode, shown in FIG. 2 or FIG. 3. In FIG. 4A, the abscissa represents voltages of the bottom gate electrode (Vg), and the ordinate represents logarithm (log 2) of current of the drain electrode (Id). In FIG. 4B, the abscissa represents voltages of the bottom gate electrode (Vg), and the ordinate represents the square root of current of the drain electrode (Id). Each of the FIG. 4A and the FIG. 4B show a plurality of Id-Vg curves, each curve corresponds to the voltage of the top gate electrode kept constant, and the current of the drain electrode changing with the voltage of the bottom gate electrode. The curves from left to right along the abscissa direction correspond to the top gate voltages of 20V, 15V, 10V, 5V, 0V, −5V, −10V, −15V, and −20V, respectively. That is, FIG. 4A and FIG. 4B show a relationship between the voltage of the top gate electrode, the voltage of the bottom gate electrode, and the current of the drain electrode. Experiment shows that the Id-Vg curve changes with the voltage of the top gate electrode.

The gas sensors 100 and 200 in the present disclosure precisely detect the gas or certain type of gas by using the relationship between the voltage of the bottom gate electrode 20 and the current of the drain electrode 63 as the voltage of the top gate electrode 70 changes. When the gas sensors 100 and 200 are working, a constant working voltage greater than zero is applied to the bottom gate electrode 20 and a voltage signal is applied to the source electrode 61. Zero volts (zero potential) are applied to the top gate electrode 70. At this time, the semiconductor layer 40 will be transformed from semiconducting to conducting. The source electrode 61 is electrically coupled to the drain electrode 63 so the current flows through the source electrode 61, the semiconductor layer 40, and the drain electrode 63 in order. If gas is adsorbed on the top gate electrode 70, the voltage potential of the top gate electrode 70 will no longer be equal to zero, and the voltage of the bottom gate will remain unchanged, but the current of the drain will change based on the Id-Vg curves in FIG. 4A and FIG. 4B. Thereby, a gas can be detected based on a change in the current of the drain electrode.

A formula $I_{ratio}=Id/Id_0$ can be applied, where $Id_0$ represents the current of the drain electrode when the voltage potential of the top gate electrode is zero and Id represents the current of the drain electrode when the gas sensor meets any gas molecules.

The gas sensor of the present disclosure does not need an analyte layer on its outer surface, which can effectively prevent the formation of reaction products of the gas and the analyte layer. The gas sensor disclosed uses adsorbed gas to change the voltage potential of the top gate electrode, and thus the current of the drain electrode changes, so that the gas can be detected based simply on change in current of the drain electrode. The gas sensor has a fast sensing speed with accuracy.

Figure 5:
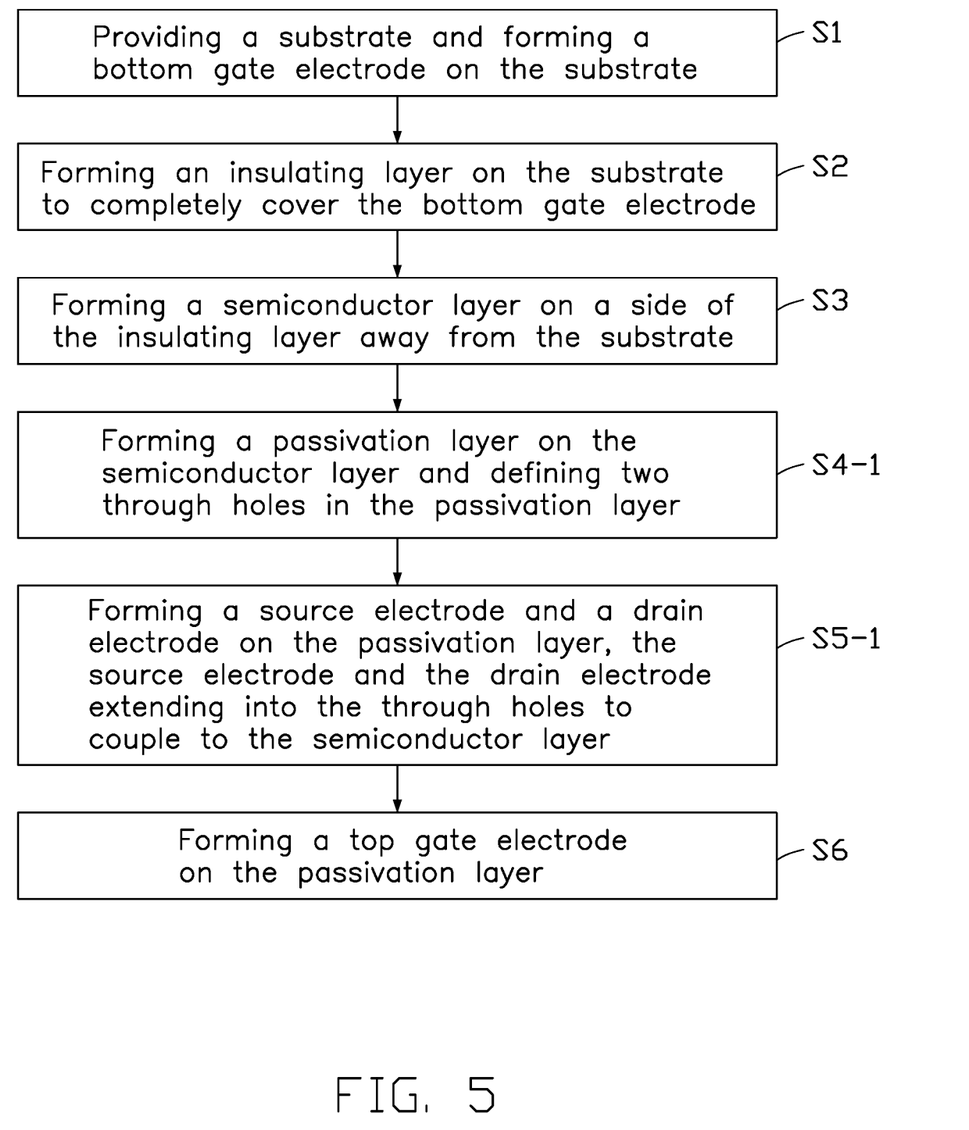
FIG. 5 is a flowchart of a method for making the gas sensor of the first embodiment.

FIG. 5 illustrates a flowchart of a method for making the gas sensor of the first embodiment. The example method is provided by way of example, as there are a variety of ways to carry out the method. Each block shown in FIG. 5 represents one or more processes, methods, or subroutines, carried out in the exemplary method. Furthermore, the illustrated order of blocks is by example only and the order of the blocks can change. The exemplary method can begin at block S1 according to the present disclosure. Depending on the embodiment, additional steps can be added, others removed, and the ordering of the steps can be changed.

At block S1: a substrate is provided and a bottom gate electrode is formed on a surface of the substrate.

At block S2: an insulating layer is formed on the substrate and completely covers the bottom gate electrode.

At block S3: a semiconductor layer is formed on a side of the insulating layer away from the substrate.

At block S4-1: a passivation layer is formed on a side of the semiconductor layer away from the substrate, and two spaced through holes are defined in the passivation layer to partially expose the semiconductor layer.

At block S5-1: a source electrode and a drain electrode spaced apart from each other are formed on a side of the passivation layer away from the substrate, and each of the source electrode and the drain electrode also extends into one of the through holes to couple with the semiconductor layer.

At block S6: a top gate electrode is formed on a side of the passivation layer away from the substrate.

Figure 6:
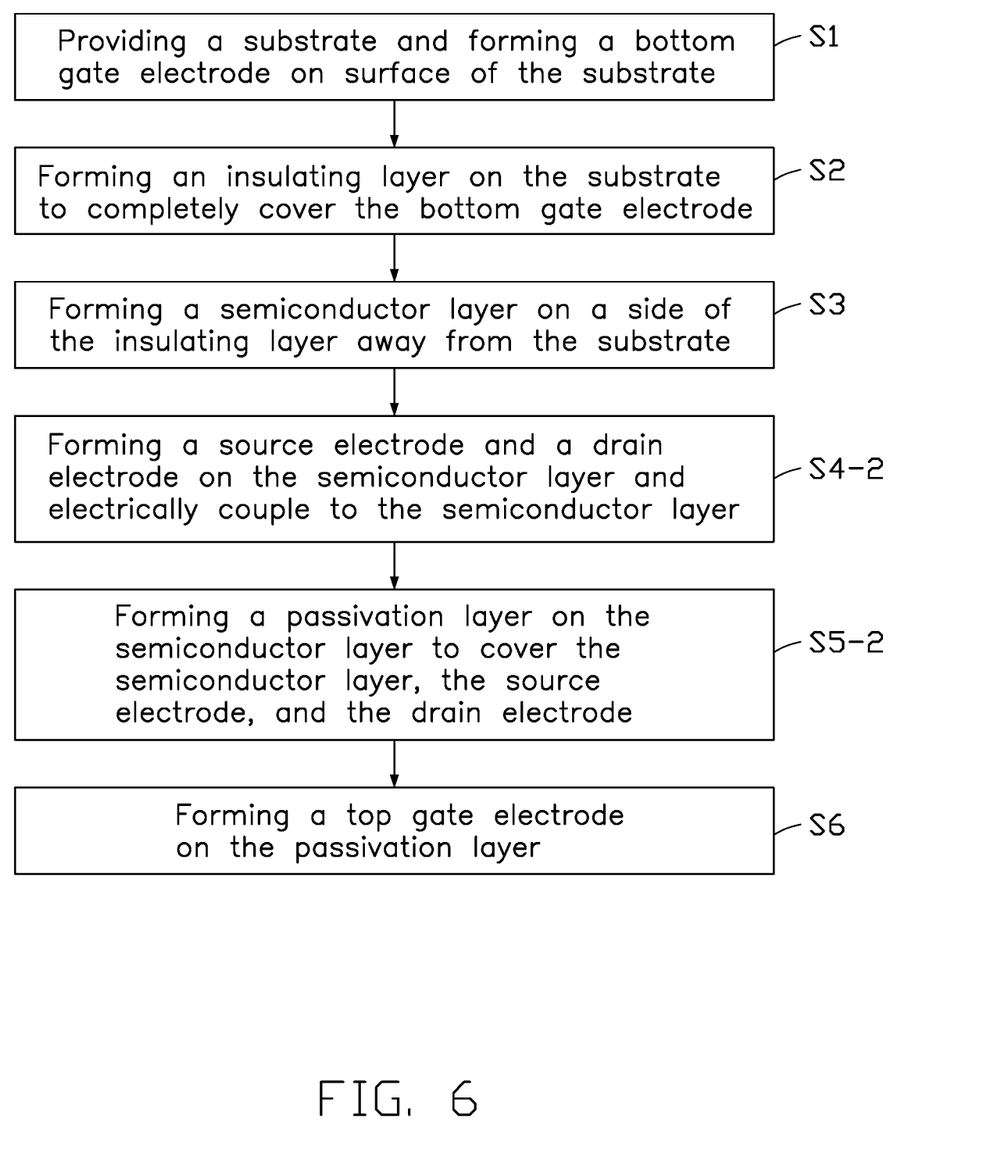
FIG. 6 is a flowchart of a method for making the gas sensor of the second embodiment.

FIG. 6 illustrates a flowchart of a method for making the gas sensor of the second embodiment. The example method is provided by way of example, as there are a variety of ways to carry out the method. Each block shown in FIG. 6 represents one or more processes, methods, or subroutines, carried out in the exemplary method. Furthermore, the illustrated order of blocks is by example only and the order of the blocks can change. The exemplary method can begin at block S1 according to the present disclosure. Depending on the embodiment, additional steps can be added, others removed, and the ordering of the steps can be changed.

At block S1: a substrate is provided and a bottom gate electrode is formed on a surface of the substrate.

At block S2: an insulating layer is formed on the substrate, completely covering the bottom gate electrode.

At block S3: a semiconductor layer is formed on a side of the insulating layer away from the substrate.

At block S4-2: a source electrode and a drain electrode spaced apart from each other are formed on a side of the semiconductor layer away from the substrate to connect with the semiconductor layer.

At block S5-2: a passivation layer is formed on the semiconductor layer to completely cover the source electrode, the drain electrode, and the semiconductor layer.

At block S6: a top gate electrode is formed on a side of the passivation layer away from the substrate.

Step S1 may specifically include: forming a conductive layer on a surface of the substrate, and patterning the conductive layer to form the bottom gate electrode partially covering the surface of the substrate.

Step S3 may specifically include: forming a semiconductor material layer on a surface of the insulating layer away from the substrate, and patterning the semiconductor material layer to form a semiconductor layer partially covering the insulating layer.

Step S4-2 may specifically include: forming a conductive layer on a side of the semiconductor layer away from the substrate, and patterning the conductive layer to form the spaced source and drain electrodes.

Step S6 may specifically include: forming a conductive layer on a side of the passivation layer away from the substrate, and patterning the conductive layer to form the top gate electrode. The top gate electrode is made of an electrically-conductive and gas-sensitive material. The gas-sensitive material refers to a material which changes its physical and/or chemical properties when in contact with a certain type of gas. In this embodiment, the top gate electrode is made of a gas-sensitive material such as nano gold and nano platinum which change their voltage potential on adsorbing the gas.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A gas sensor, comprising:
a substrate;
a bottom gate electrode on a surface of the substrate;
an insulating layer on the surface of the substrate with the bottom gate electrode thereon, the insulating layer covering the bottom gate electrode; a semiconductor layer on a surface of the insulating layer away from the substrate;
a source electrode and a drain electrode spaced apart from each other, each of the source electrode and the drain electrode being located on a side of the semiconductor layer away from the substrate and coupled to the semiconductor layer;
a passivation layer on the semiconductor layer; and
a top gate electrode on a surface of the passivation layer away from the substrate and spaced apart from each of the source electrode and the drain electrode;
wherein the top gate electrode is made of an electrically-conductive and gas-sensitive material.

2. The gas sensor of claim 1, wherein the top gate electrode is made of a material which a voltage potential of the material changes when the material adsorbs a certain type of gas.

3. The gas sensor of claim 2, wherein the top gate electrode is made of nano gold or nano platinum.

4. The gas sensor of claim 1, wherein each of the source electrode and the drain electrode is on a side of the passivation layer away from the substrate and extends through the passivation layer to contact with the semiconductor layer.

5. The gas sensor of claim 1, wherein the passivation layer is on the insulating layer and covers the semiconductor layer, the source electrode, and the drain electrode.

6. The gas sensor of claim 1, wherein a projection of the semiconductor layer on the substrate overlaps a projection of the bottom gate electrode on the substrate along a thickness direction of the gas sensor.

7. The gas sensor of claim 1, wherein a projection of the top gate electrode on the substrate at least partially overlaps with a projection of the bottom gate electrode on the substrate along a thickness direction of the gas sensor.

8. A method for making a gas sensor, comprising:
providing a substrate and forming a bottom gate electrode on surface of the substrate;
forming an insulating layer on the substrate to completely cover the bottom gate electrode;
forming a semiconductor layer on a side of the insulating layer away from the substrate;
forming a passivation layer on a side of the semiconductor layer away from the substrate and defining two through holes spaced apart from each other in the passivation layer to expose the semiconductor layer;
forming a source electrode and a drain electrode on a side of the passivation layer away from the substrate, each of the source electrode and the drain electrode extending into one of the two through holes to electrically couple to the semiconductor layer; and
forming a top gate electrode on a side of the passivation layer away from the substrate;
wherein forming the top gate electrode comprises forming the top gate electrode made of an electrically-conductive and gas-sensitive material.

9. The method of claim 8, wherein forming the top gate electrode comprises forming the top gate electrode made of nano gold or nano platinum.

10. A method for making a gas sensor, comprising:
providing a substrate and forming a bottom gate electrode on surface of the substrate;
forming an insulating layer on the substrate to completely cover the bottom gate electrode;
forming a semiconductor layer on a side of the insulating layer away from the substrate;
forming a source electrode and a drain electrode on a side of the semiconductor layer away from the substrate and electrically couple to the semiconductor layer;
forming a passivation layer on the semiconductor layer to completely cover the semiconductor layer, the source electrode, and the drain electrode; and
forming a top gate electrode on a side of the passivation layer away from the substrate;
wherein forming the top gate electrode comprises forming the top gate electrode made of an electrically-conductive and gas-sensitive material.

11. The method of claim 10, wherein forming the top gate electrode comprises forming the top gate electrode made of nano gold or nano platinum.

* * * * *